(12) United States Patent
Delshadpour

(10) Patent No.: US 10,819,297 B1
(45) Date of Patent: Oct. 27, 2020

(54) GAIN STAGE WITH OFFSET CANCELLATION CIRCUIT FOR A FIXED HIGH-PASS POLE

(71) Applicant: NXP B.V., Eindhoven (NL)

(72) Inventor: Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 71 days.

(21) Appl. No.: 16/397,561

(22) Filed: Apr. 29, 2019

(51) Int. Cl.
*H03F 3/45* (2006.01)
*H03G 1/00* (2006.01)
*H03G 3/30* (2006.01)

(52) U.S. Cl.
CPC ..... *H03F 3/45748* (2013.01); *H03F 3/45183* (2013.01); *H03G 1/0029* (2013.01); *H03G 3/30* (2013.01)

(58) Field of Classification Search
CPC .............................. H03F 3/457; H03G 1/0029
See application file for complete search history.

(56) References Cited

U.S. PATENT DOCUMENTS

| | | | |
|---|---|---|---|
| 6,321,073 B1 * | 11/2001 | Luz | H03G 3/3068 455/239.1 |
| 6,331,803 B1 | 12/2001 | Zheng et al. | |
| 6,441,686 B1 | 8/2002 | Nakamura | |
| 6,741,131 B2 | 5/2004 | Nicklasson | |
| 6,819,176 B1 * | 11/2004 | Lee | H03F 1/34 330/124 R |
| 6,903,593 B2 | 6/2005 | Wang | |
| 7,302,246 B2 | 12/2007 | Tseng et al. | |
| 7,695,085 B2 | 4/2010 | Bae et al. | |
| 10,110,995 B2 * | 10/2018 | Klippel | H04R 29/001 |
| 2005/0277396 A1 * | 12/2005 | Pipilos | H04L 25/061 455/253.2 |

(Continued)

FOREIGN PATENT DOCUMENTS

| | | |
|---|---|---|
| EP | 1193857 A2 | 4/2002 |
| EP | 1193857 A3 | 4/2002 |
| JP | 2007-150434 A | 6/2007 |

OTHER PUBLICATIONS

Pourashraf, Shirin et al; "An Op-Amp Approach for Bandpass VGAs With Constant Bandwidth"; IEEE Transactions on Circuits and Systems II: Express Briefs, vol. 65, Issue: 9; pp. 1144-1148 (2018).

(Continued)

*Primary Examiner* — Patricia T Nguyen

(57) ABSTRACT

A gain stage includes an offset cancellation loop coupled to a first amplifier. The first amplifier has a first transfer function and a first gain, and the offset cancellation loop includes a second amplifier having a second transfer function and a second gain. The second transfer function is based on an inverse of the first transfer function and the second gain based on an inverse of the first gain. When the offset cancellation loop feeds back an output signal of the first amplifier to an input of the first amplifier, a high-pass pole (or high-pass corner frequency) of the first amplifier is maintained at a constant level in spite of variations in the gain of the first amplifier. In one case, the second amplifier in the offset cancellation loop may be a simpler and lower power version of the first amplifier.

21 Claims, 10 Drawing Sheets

(56) References Cited

U.S. PATENT DOCUMENTS

| | | | |
|---|---|---|---|
| 2006/0265167 A1* | 11/2006 | Laraia ................. | G01D 3/0365 |
| | | | 702/99 |
| 2008/0129563 A1* | 6/2008 | Boomer ............. | H03M 1/1023 |
| | | | 341/120 |
| 2017/0104502 A1* | 4/2017 | Pratt ...................... | H03M 1/12 |

OTHER PUBLICATIONS

Shin, Hyunchol et al; "A CMOS Active-RC Low-Pass Filter With Simultaneously Tunable High and Low-Cutoff Frquencies for IEEE 802.22 Applications"; IEEE Transactions on Circuits and Systems II: Express Briefs, vol. 57, Issue 2; pp. 85-980 (2010).

\* cited by examiner

GAIN STAGE WITH OFFSET CANCELLATION CIRCUIT FOR A FIXED HIGH-PASS POLE

TECHNICAL FIELD

Example embodiments disclosed herein relate generally to processing signals.

BACKGROUND

Amplifiers are used to control signal level for a variety of applications. One type of amplifier known as a voltage-controlled gain amplifier (VGA) controls gain based on a control voltage. Another type of amplifier known as a programmable gain amplifier (PGA) controls gain based on an analog or digital control signal, the latter of which may make stepwise adjustments in the gain of an input signal.

In some applications, PGAs and VGAs are used to provide a fixed output voltage for different input signal levels. Because these applications often use a high maximum gain, any offset voltage or spurious signals coming from a previous or present stage will be amplified. The amplified offset voltage adversely affects the performance of the host system (e.g., a receiver), and in some cases may degrade or destroy the quality of the output signal.

Various attempts have been made to suppress amplified offset voltage. One attempt involves using an AC coupling capacitor. However, this approach consumes significant space on the printed circuit board or chip of the receiver and also increases costs. Another attempt involves using an offset correction DAC/ADC method. However, this approach increase the complexity of the receiver. Another approach involves performing a low-pass filtering operation in an offset cancellation loop. However, as previously implemented, this approach moves the corner frequency of the filter with changes in gain and thus produces a moving high-pass pole. Also, as previously implemented, this approach consumes substantial signal bandwidth, which degrades the quality of the output signal.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, a gain stage includes a first amplifier and an offset cancellation loop coupled to the first amplifier. The first amplifier has a first transfer function and a first gain, and the offset cancellation loop includes a second amplifier having a second transfer function and a second gain. The second transfer function is based on an inverse of the first transfer function and the second gain is based on an inverse of the first gain. The offset cancellation loop is configured to feed back an output signal of the first amplifier to an input of the first amplifier. The output signal may be fed back to the input of the first amplifier maintains a high-pass pole of the first amplifier at a substantially constant level irrespective of changes in the first gain of the first amplifier. The high-pass pole may correspond to a high-pass corner frequency of the first amplifier.

The first transfer function may be shifted by a first amount relative to the high-pass corner frequency and the second transfer function is offset by a second amount relative to the high-pass corner frequency, and wherein the second amount may at least partially offset the first amount. The second amplifier may change the second gain to correspond to changes in the first gain of the first amplifier to maintain the high-pass pole of the first amplifier at the substantially constant level.

The first amplifier may be a voltage-controlled gain amplifier, the second amplifier may be a voltage-controlled gain amplifier, the first gain of the first amplifier may be set by a first voltage control signal, and the second gain of the second amplifier may be set by a second voltage control signal. The first voltage control signal may set the first gain to a value on a first gain curve, and the second voltage control signal may set the second gain to a value on a second gain curve. The second gain may be an inverse of the first gain, the second gain curve may be an inverse of the first gain curve, and a product of the first gain and the second gain may be a constant value.

The first amplifier may be a programmable gain amplifier, the second amplifier may be a programmable gain amplifier, the first gain of the first amplifier may be set by a first digital code, and the second gain of the second amplifier may be set by a second digital code. The first digital code may be set the first gain to a value on a first waveform, and the second digital code may be set the second gain to a value on a second waveform. The second waveform may be an inverse of the first waveform, and a product of the first gain and the second gain may be set to maintain the high-pass pole of the first amplifier at the substantially constant level. The first amplifier may include a plurality of amplifier circuits, the plurality of amplifier circuits may have a plurality of gains, and the second gain of the second amplifier may be based on an inverse of a sum of the plurality of gains of the plurality of amplifier circuits.

In accordance with one or more embodiments, a control system includes a first signal line coupled to a first amplifier, a second signal line coupled to a second amplifier, and a controller configured to output a first control signal to the first signal line and a second control signal to the second signal line. The second control signal controls a gain of the second amplifier to maintain a high-pass corner frequency of the first amplifier at a substantially constant level for different values of the gain of the first amplifier.

The controller may control the gain of the second amplifier to be an inverse of the gain of the first amplifier. The high-pass corner frequency may correspond to a high-pass pole of a filter implemented by the first amplifier. The first amplifier may be a voltage-controlled gain amplifier, the first control signal may include a first voltage control signal, the second amplifier may be a voltage-controlled gain amplifier, and the second control signal may include a second voltage control signal.

The first amplifier may be a programmable gain amplifier, the first control signal may be a first digital control signal, the second amplifier may be a programmable gain amplifier, and the second control signal may be a second digital control signal. The controller may convert the first digital control signal into the second digital control signal.

In accordance with one or more embodiments, a gain stage includes a first amplifier and an offset cancellation loop coupled to the first amplifier, wherein the first amplifier has a first transfer function and a first gain and the offset cancellation loop includes a second amplifier coupled to a filter. The second amplifier includes a second gain based on an inverse of the first gain, and the filter has a second transfer function based on an inverse of the first transfer function. The offset cancellation loop feeds back an output signal of the first amplifier to an input of the first amplifier. The output signal fed back to the input of the first amplifier maintains a high-pass pole of the first amplifier at a substantially constant level irrespective of changes in the first gain of the first amplifier. The first amplifier may operate at a first current and a first bandwidth, the second amplifier may operate at a second current and second bandwidth, and the second current may be lower than the first current and the second bandwidth is narrower than the first bandwidth.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1A:
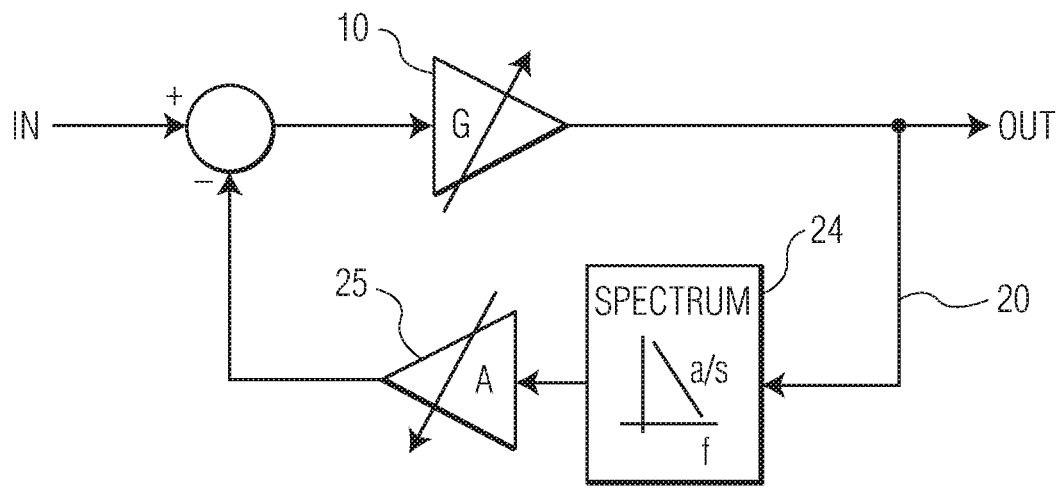
FIG. 1A illustrates an embodiment of a gain stage.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Various attempts have been made to correct offset and other spurious signals in amplifier applications. One attempt involves performing a low-pass filtering operation in an offset cancellation loop. Performing a low-pass filtering operation in an offset cancellation loop produces a high-pass pole. As gain increases, the high-pass pole (or high-pass corner frequency) fhp moves to a higher frequency, which consumes substantial signal bandwidth (BW). As a result, the quality of the output signal is reduced.

Example embodiments describe an approach which maintains the high-pass pole (e.g., high-pass corner frequency) of a gain amplifier at a constant level for different values of gain. At the same time, these or other embodiments reduce design complexity, promote stability and predictable signal quality, is space efficient in that it does not consume substantial or additional area on a chip or printed circuit board.

FIG. 1A illustrates an embodiment of a gain stage which includes a gain amplifier 10 and an offset cancellation loop 20 coupled to the gain amplifier. The gain amplifier 10 may be a first variable-gain amplifier which amplifies an input signal In to generate an output signal with increased gain. Examples of the gain amplifier 10 include as voltage-controlled gain amplifier or a programmable gain amplifier including one or more amplification stages.

The offset cancellation loop 20 includes a second gain amplifier 25 that processes the signal output from the first gain amplifier 20. In one embodiment, the offset cancellation loop effectively operates as an integrator with a set gain that feeds the output signal of the first gain amplifier 10 back to its input. In operation, the integrator shapes a high-pass pole in the feedback loop in a manner which maintains the high-pass pole (e.g., high-pass corner frequency) at a predetermined constant level, which, for example, may be determined based on an intended application or the requirements of a host system. The integrator may perform this function by effectively operating as a low-pass filter that transforms the low-pass pole of the filter into a high-pass pole for stabilizing the corner frequency of the gain amplifier 10.

A frequency spectrum of the signal fed back to the offset cancellation loop 20 may be illustrated in box 24, which, for example, may operate as an integrator. The spectrum includes components (a/s) which may be partially or fully suppressed using an inverse transfer function (s/a) and gain control features, for example, in a manner described in greater detail below. In one embodiment, the offset cancellation loop 20 may apply the inverse transfer function and perform gain control using the second gain amplifier 25, which in this case operates both as a filter (e.g., low-pass filter) and amplifier as described herein relative to some embodiments. In another embodiment, box 24 may correspond to a filter (e.g., low-pass filter) that applies the inverse transfer function to the fed back signal and the second gain amplifier 25 may perform the gain control based on a gain A to be described in greater detail.

Figure 1B:
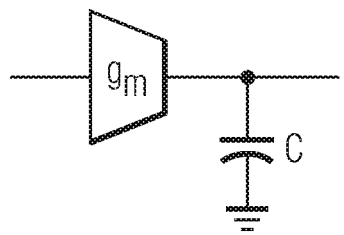
FIG. 1B illustrates an embodiment of an amplifier circuit.

FIG. 1B illustrates an equivalent circuit diagram of one example of the integrator or low-pass filter. In this example, the second gain amplifier 25 (or low-pass filter) in the offset cancellation loop 20 includes a gm-C circuit (filter) with a predetermined transconductance gm that conforms to system requirements. In one embodiment, the transconductance of the filter may be tuned based on a bias circuit input into an operational amplifier and by setting the capacitance of the capacitor C.

Figure 1C:
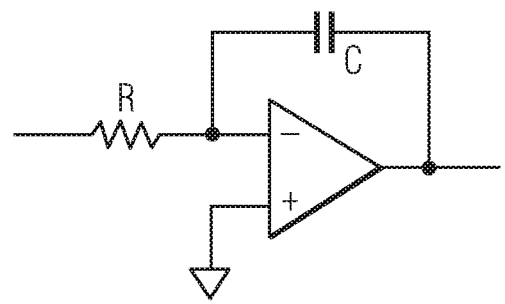
FIG. 1C illustrates an embodiment of an amplifier circuit.

FIG. 1C illustrates an equivalent circuit diagram of another type of integrator or low-pass filter. In this example, the low-pass filter includes an operational amplifier with its non-inverting terminal coupled to a reference potential (e.g., ground) and its inverting terminal coupled to an RC circuit, where R is coupled to the inverting terminal and C is coupled across this terminal and the output of the operational amplifier. The circuits of FIG. 1A to 1C may be used in a variety of applications, including but not limited to amplifying a channel signal of a wired or wireless receiver.

Figure 2:
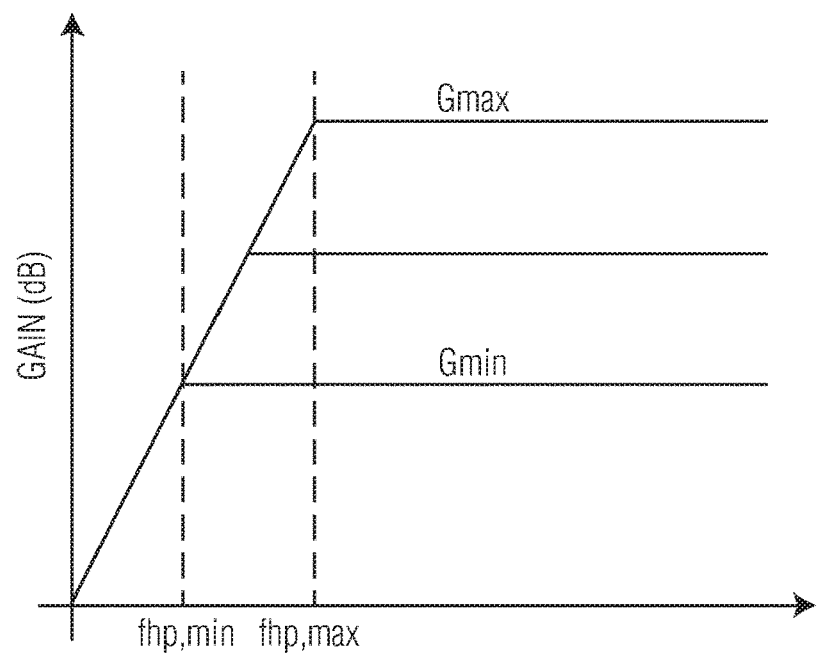
FIG. 2 illustrates an example of a gain stage having a variable a high-pass corner frequency.

FIG. 2 illustrates a frequency response of a gain stage which has a high-pass corner frequency that varies with different gain values. This frequency response is presented for comparison purposes, in order to explain an example of performance improvements that may be attained by one or more embodiments described herein. Different improvements may be attained in another embodiments.

Referring to FIG. 2, the frequency response is that of a high-pass filter with a corner frequency (fhp) that shifts with different values of gain. For example, a first (minimum) value of the gain Gmin of amplifier 10 has a first (minimum) corner frequency fhp, min and a second (maximum) value of the gain Gmax of amplifier 10 has a second (maximum) corner frequency fhp, min. The first and second corner frequencies define range within which corner frequencies may shift for different gain values. The high-pass corner frequency variation in this case may be expressed in Equation 1.

$$fhp,max = fhp,min*(G\ max - G\ min) \quad (1)$$

A shift in corner frequency (or high-pass pole) may destabilize the output of the gain stage and degrade signal quality. For example, consider the case where Gain=0 dB (1) for a high-pass corner frequency (fhp)=1 KHz and Gain=60 dB (1000) for an fhp=1 MHz. In this example, it is evident that a system (e.g., receiver) having a bandwidth (BW) of only a few megahertz cannot tolerate a high-pass corner fhp=1 MHz. Thus, in order to set the maximum value of the high-pass corner frequency (fhp,max), fhp,min=fhp,max/Gain,max. This value may turn out to be very low and thus is undesirable for many applications.

One attempt to address this problem involves using a very large capacitor in a feedback loop. For example, if fhp,max is required to be at a frequency f0 in order to satisfy system requirements, then the gain stage may be designed for f0/Gmax in order to maintain the high-pass corner at frequency f0 for gain G=1 (0 dB). In order to achieve this setting, the low-pass pole of an offset cancellation loop which does not employ the embodiments described herein may be set at Gmax times smaller, e.g., Gmax*f0/Gmax=f0. When the offset cancellation loop operates as an integrator based on 1/(RC) or gm/C, the capacitor value may be set Gmax times larger to maintain the f0 corner frequency. However, increasing the capacitor value will lower the value of 1/(RC) or gm/C, which may be expense because a smaller pole=larger C in the feedback loop.

In accordance with one or more embodiments, the offset cancellation loop 20 in FIG. 1 maintains the high-pass corner frequency of the first gain amplifier 10 without using a large capacitor. This is accomplished by offsetting (or correcting) a shift in the high-pass pole fhp that takes place in the output of the first gain amplifier 10 based on setting the low-pass pole of the second gain amplifier 25 (or filter) in the feedback loop; in other words, by making the high-pass pole of the gain amplifier 10 (i=or equally low pass pole of integrator) "low" without using a large-value capacitor.

Figure 3:
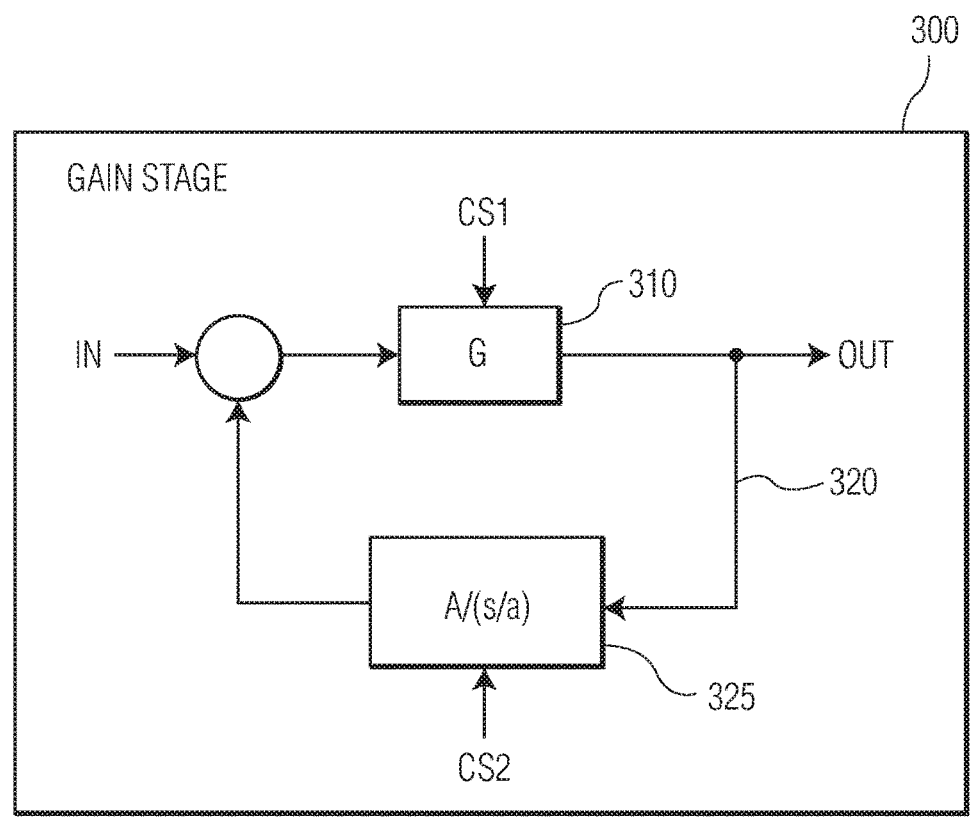
FIG. 3 illustrates another embodiment of a gain stage.

FIG. 3 illustrates an embodiment of a gain stage 300 which may be a more detailed implementation of the gain stage in FIG. 1. As illustrated in FIG. 3, the gain stage 300 includes an offset cancellation loop 320 for maintaining the high-pass corner frequency of the first gain amplifier 310 without using a large capacitor. The transfer function of the offset cancellation loop 320 (e.g., the second gain amplifier 325 performing both filtering and gain control operations) may correspond to Equation 2.

$$Out/In = s*G/(s + a*G*A) \quad (2)$$

where G is the gain of the first gain amplifier 310, A is the gain of the second gain amplifier, s corresponds to j2πf (or jω), and in one embodiment may depend on the working domain of the transfer function H(s)=A/(s/a), where s is j2πf, and a=1/RC or gm/C depending on the type of integrator implemented by the second gain amplifier 325.

When the integrator is designed based on Equation 2, the offset cancellation loop 320 may have a high-pass pole that may be expressed by Equation 3.

$$|s| = (a*A*G) \quad (3)$$

In other words, the feedback system formed by the offset cancellation loop 320 corrects any offset in the first gain amplifier 310 produced by a shift in the high-pass pole of this amplifier. This offset may be achieved by designing the transfer function of the low-pass filter corresponding to the second gain amplifier 325 to have an inverse of the transfer function of the first (or main) gain amplifier 310 relative to the gain and ratio of the s and a values shown above. This is evident from a comparison of the spectrum of the first gain amplifier 310 and the spectrum of the second gain amplifier 325.

For example, the spectrum of the output of the first gain amplifier 310 corresponds to curve in box 24 of FIG. 1. The spectrum of the output of the second gain amplifier 325 is (s/a), which is the inverse of the spectrum output from the first gain amplifier as illustrated in FIG. 3. When the output of the offset cancellation loop 320 is input into the first gain amplifier 310, the following cancellation takes place: A(s/a)*G(a/s)=AG=constant.

The product of A and G may be maintained at a constant value, for example, as follows. Because G is the gain of the first gain amplifier 310, the gain A of the second gain amplifier 325 should be proportional to the inverse of G, e.g., 1/G. Setting the gain A in this manner and designing the second gain amplifier 325 to have a transfer function of A/(s/a), where A is proportional to the inverse of G the gain of the first gain amplifier 310 with a transfer function (a/s), will ensure that the high-pass corner frequency fhp of the first gain amplifier 310 (and thus gain stage 300) is maintained at a consent value, irrespective of variations in gain G or any offset in the output of amplifier 310.

Using the offset cancellation loop 320, it is therefore apparent that any offset output from the first gain amplifier 310 is partially or entirely corrected without using a large-value capacitor. Thus, the output of the first gain amplifier (and the gain stage) maintains a constant high-pass corner frequency irrespective of changes in the gain (G) value of the first gain amplifier, because the gain (A) of the second gain amplifier will be set to vary with changes in the gain G of the first gain amplifier. In the above equations, it may be assumed for the sake of simplicity that the bandwidth of the gain stage is relatively high or even infinity. In one embodiment, setting the values of A and G may be performed automatically, for example, based on a controller of the gain stage and/or the host system or circuit. Examples of control signals CS1 and CS2 output from the controller are illustrated in FIG. 3 for proportionally adjusting the gains G and A of the gain amplifiers.

Figure 4:
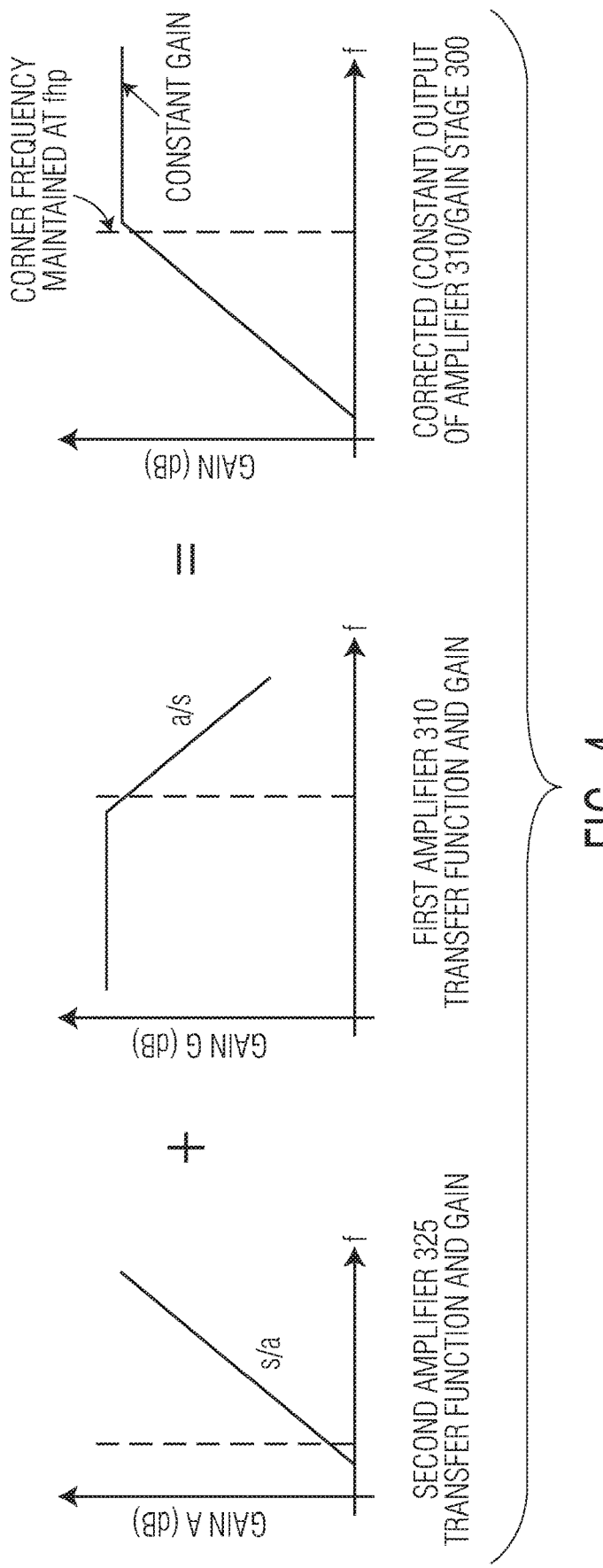
FIG. 4 illustrates an embodiment for maintaining the high-pass corner frequency constant.

FIG. 4 illustrates an example of a pole/zero effect on the AC response of the gain stage 300 produced by the offset cancellation loop 320 of FIG. 3. In the first graph of FIG. 4, the gain A and transfer function (s/a) of the second amplifier 325 in the offset cancellation loop are illustrated relative to corner frequency (fhp) offset by an amount. In the second graph of FIG. 4, the gain G and transfer function (a/s) of the first amplifier 310 (which is coupled to the offset cancellation loop 320) are illustrated relative to a corner frequency (fhp) that has been shifted. In the third graph of FIG. 4, assuming a is a fixed value, the product of the gain (A) of the second amplifier having a transfer function of (s/a) and the gain (G) of the first amplifier having a transfer function of (a/s) may be constant value at the corner frequency fhp when the output of the offset cancellation loop 320 is input into the first amplifier 310. The constant gain and high-pass corner frequency of the first amplifier 310 are maintained by the offset cancellation loop, irrespective of variations in gain and/or shifts in the high-pass corner frequency (or high-pass pole) that occur in or are produced by the first amplifier.

Figure 5A:
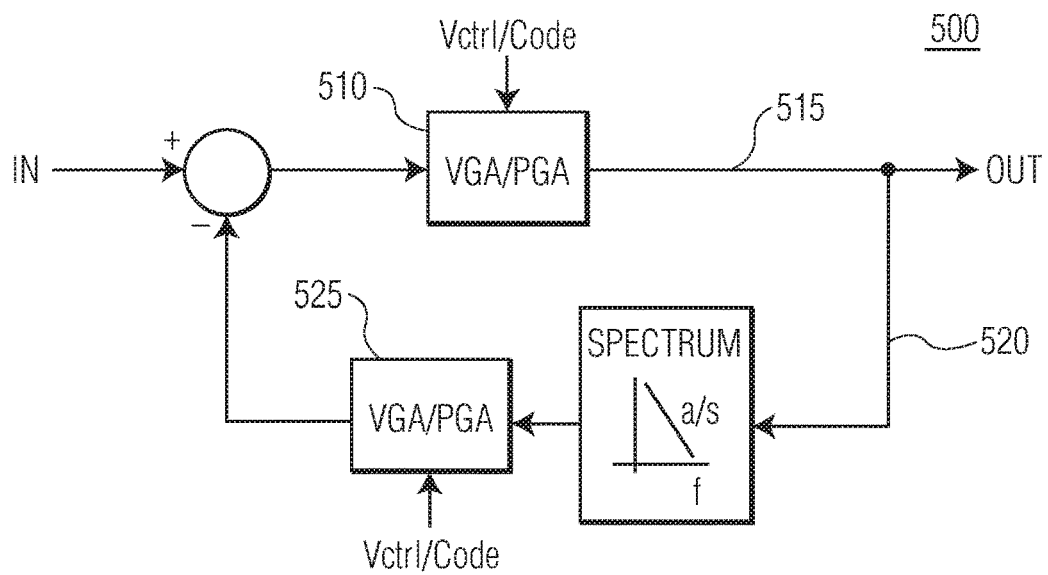
FIG. 5A illustrates another embodiment of a gain stage.
Figure 5B:
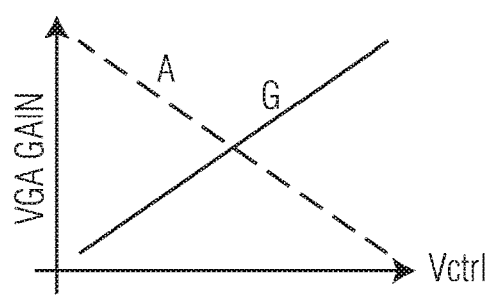
FIG. 5B illustrates an example of gain curves for an embodiment using voltage-control gain amplifiers.
Figure 5C:
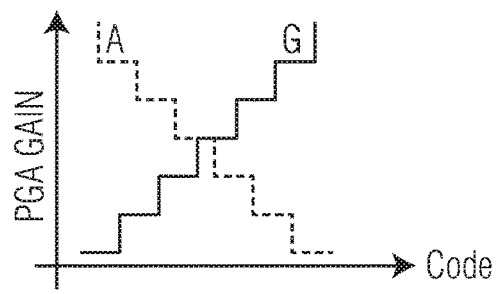
FIG. 5C illustrates an example of gain waveforms for an embodiment using programmable gain amplifiers.

FIG. 5A illustrates an embodiment of a gain stage 500 including voltage-controlled gain amplifiers (VGAs) or programmable gain amplifiers (PGAs), and FIGS. 5B and 5C illustrate examples of the gain control performed by the VGAs and PGAs, respectively. The gain stage 500 may correspond, for example, to the gain stage of FIG. 1 or another gain stage. In at least one embodiment, the VGA/PGA 525 may be a low-current, low-bandwidth version of VGA/PGA 510.

Figure 12:
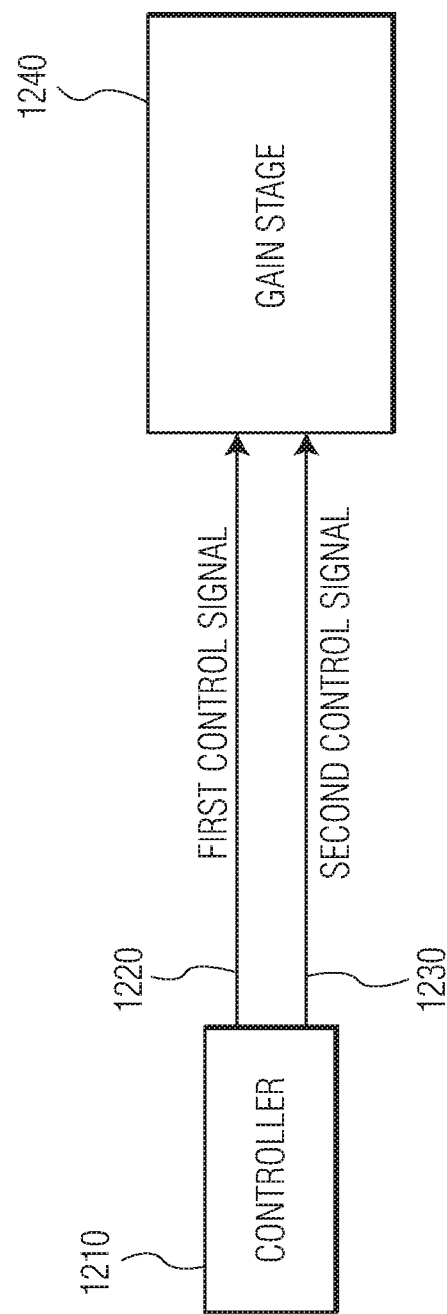
FIG. 12 illustrates an embodiment of a control system.

In FIG. 5B, VGA 510 in the main channel path 515 has a gain of G with a predetermined slope. The value of the gain G of the VGA is set based on a voltage control signal Vctrl input into the VGA, for example, by a controller. The controller may be, for example, a controller of a receiver or other host system or circuit that sets the gain based on an intended application. (An example of the controller is illustrated in FIG. 12.) In the offset cancellation loop 520, the value of gain A of the VGA 525 may be based on the voltage control signal Vctrl input into the VGA 510, but with a different (e.g., inverse) slope in order to perform offset cancellation and thus to maintain the high-pass corner frequency of amplifier 510 at a constant level. The transfer function of the filter implemented by the VGA 525 (or of a filter coupled to VGA 525 in the feedback loop 520) may also be an inverse of the transfer function of the filter implemented by VGA 510 for these purposes.

In one embodiment, the slopes of the gain curves of VGA 510 and VGA 525 may be different provided the product of A and G is constant (e.g., G*A=constant) in order to ensure that the high-pass corner frequency remains stable and unshifted for different gain values. In this or another embodiment, the gain values of A and G may be different provided this difference is compensated in one or more ways. For example, the transfer functions of one or both of the VGAs may be different to compensate for different G and A values, and/or one or more other features may be included in the main channel 515 or the offset cancellation loop 520 to perform compensation, so that a constant high-pass pole is maintained.

In FIG. 5C, PGA 510 in the main channel path has a gain of G set by a predetermined waveform. Because this implementation is digital, the value of the gain G of the PGA may be set based on an n-bit code. When the waveform is a stepped waveform, the code may identify the step in the waveform to be used in setting the gain G. The code may be output from a controller, which, for example, may be included in a receiver or other host system or circuit. In this case, the value of G may be set to satisfy the requirements of an intended application.

The code used to set the value of gain A of PGA 525 may be based on the digital code used to set the gain G in the PGA 510. Accordingly, the code for PGA 525 may reference a gain waveform different from the waveform used for gain G. In one embodiment, the gain waveform for A may be an inverse of the stepped waveform for G. For example, the value of the digital code used to set gain A may be different from the value of the digital code used to set gain G, and in one case may be a value set to apply an inverse of the gain G. Through these digital control signals, the high-pass corner frequency (and thus the high-pass pole) of the gain stage may be maintained at a constant value. The gain waveforms for A and G may be different from stepped waveforms in another embodiment.

Figure 6A:
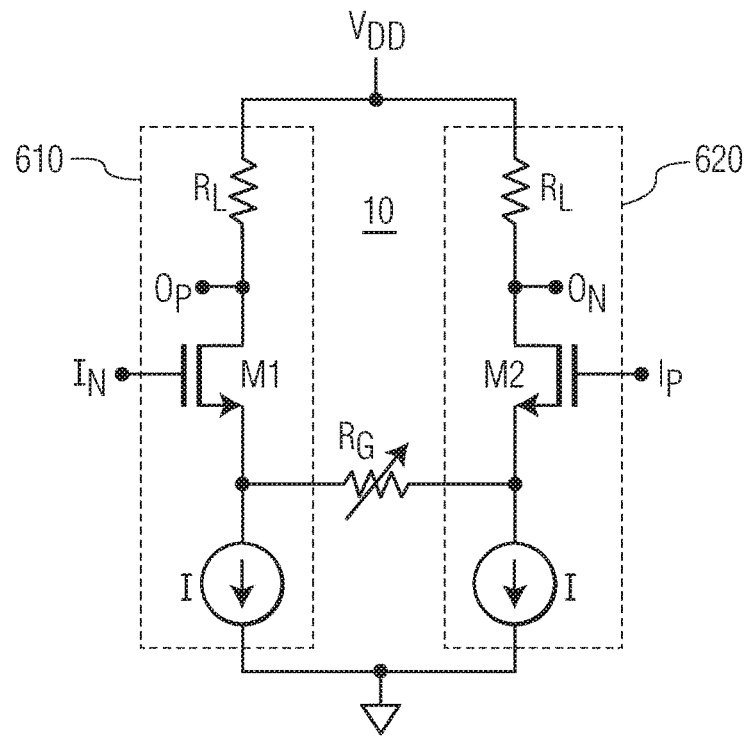
FIGS. 6A and 6B illustrate embodiments of amplifier circuits.
Figure 6B:
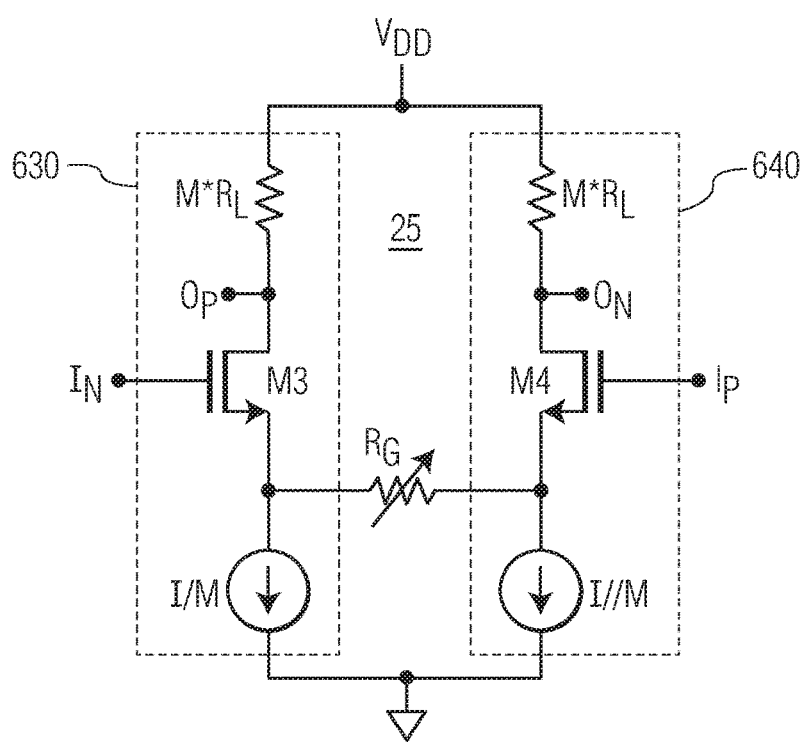

FIG. 6A illustrates an example of circuit for implementing the PGA 510 in the main channel, and FIG. 6B illustrates an example of a circuit for implementing PGA 525 in the offset cancellation loop. In both cases, the PGA circuits are differential circuits used to implement an open-loop gain stage. In another embodiment, the PGA circuits may be in single-ended form.

As illustrated in FIG. 6A, the gain amplifier for PGA 10 includes a differential pair of amplifier circuits 610 and 620 which are coupled between a common voltage supply $V_{DD}$ and a reference potential, e.g., ground. The first amplifier circuit 610 includes a first transistor M1 coupled between a first resistor and a current source. A gate of the first transistor is coupled to receive a first differential input signal $I_N$. The second amplifier circuit 620 includes a second transistor M2 coupled between a second resistor and a current source. A gate of the second transistor is coupled to receive a second differential input signal $I_P$. Each differential output signal $O_P$ and $O_N$ flows from a node between $R_L$ and a corresponding one of the transistors M1 and M2. Together, the differential input signals may correspond to the input signal $I_N$ illustrated in FIG. 1. The first and second resistors $R_L$ may have a same fixed resistance value, and the current sources I may also be the same. The first and second amplifier circuits 610 and 620 are electrically connected through a variable degeneration resistor $R_G$, which, for example, may be coupled to the sources of transistors M1 and M2.

The gain of PGA 510 may be set to different values by varying the resistance of the variable regeneration resistor $R_G$. In one embodiment, the gain G may be determined based on a ratio of $R_L$ and $R_G$, e.g., $G=R_L/R_G$. Because $R_L$ is a fixed value, the gain G is set by varying the value of $R_G$. The resistance value of $R_G$ may be set based on the digital code input into the PGA 510. In one example, the number of bits of the digital code may be based on the number of steps in the digital waveform for the programmable amplifier. For example, if the waveforms shown in FIG. 5C are used, then the digital code may have three bits because the waveforms in FIG. 5C have eight steps, e.g., each of the eight values of the three-bit digital code may correspond to a respective number of resistance values for $R_G$, which, in turn, may set one of eight gain values for PGA 510.

As illustrated in FIG. 6B, the gain amplifier for PGA 525 may have the same form as PGA 510 with several exceptions. First, the resistor between the power supply $V_{DD}$ and the output node O in each gain amplifier circuit 630 and 640 is multiplied by a predetermined factor M. Second, the current sources I are divided by the same predetermined factor M. The value of factor M may be set so that the gain of PGA 525 is the inverse of the gain G of PGA 510 (e.g., A=1/G) in order to maintain the high-pass corner frequency of the gain stage at a constant level, or at least two within a constant predetermined range. In another embodiment, the value of factor M may set A to a value different from the inverse of G if, for example, a different transfer function is used and/or one or more additional circuit features are included in the offset cancellation loop (or another portion of the gain stage) to compensate for any difference.

Like in PGA 510, the gain of PGA 525 may be set to different values by varying the resistance of the variable regeneration resistor $R_G$ connected between amplifier circuits 630 and 640. In one embodiment, the gain A may be determined based on a ratio of $M*R_L$ and $R_G$, e.g., $G=M*R_L/R_G$. Because WR, is a fixed value, the gain A is set by varying the value of $R_G$ in PGA 525. The resistance value of $R_G$ may be set based on the digital code input into the PGA 525. In one example, the number of bits of the digital code may be based on the number of steps in the digital waveform for the programmable amplifier. For example, if the waveforms shown in FIG. 5C are used, then the digital code may have three bits because the waveforms in FIG. 5C have eight steps, e.g., each of the eight values of the three-bit digital code may correspond to a respective number of resistance values for $R_G$, which, in turn, may set one of eight gain values.

However, the digital code for PGA 525 may set a gain value A that is the inverse of the gain value G set by the digital code input into PGA 510. In one embodiment, the digital code used to control the resistance value of $R_G$ in PGA 525 may be generated based on a code conversion for the digital code used to control the resistance value $R_G$ in PGA 510, so that, for example, A=1/G. The code conversion may be performed, for example, based on a controller in the receiver or other host system or circuit. For example, consider the case where the digital codes have three bits. Then, eight possible step values of gain may be set by each digital code: 000, 001, 010, . . . , 111. The code conversion may therefore be performed as follows, where the first digital code value sets the resistance of $R_G$ in PGA 10 and the second digital code value sets the resistance $R_G$ in PGA 25.

| First Digital Code Value | Second Digital Code Value |
|---|---|
| 000 | 111 |
| 001 | 110 |
| 011 | 101 |
| . | . |
| . → | . |
| . | . |
| 111 | 000 |

In one embodiment, considering a monotonic code/gain relationship for gain stage, G and A gain can be considered as follows.

$$G(0,1,2,3,\ldots,N) = \to A(N, N-1, \ldots, 2,1,0)$$

Also, in one embodiment, the resistance value for $R_G$ may be a weighted value which changes based on the digital code input into the PGA. In one embodiment, the $R_G$ may be replaced (or coupled) with another transistor $M_X$ (e.g., a MOS transistor) having a resistance value of $R_G$, as described. In this latter case, the gate control voltage of transistor $M_X$ may set the gain G or A. In this case, the gate control voltage for setting gain G may have a positive slope and the gate control voltage for setting gain A may have a negative slope.

Figure 7A:
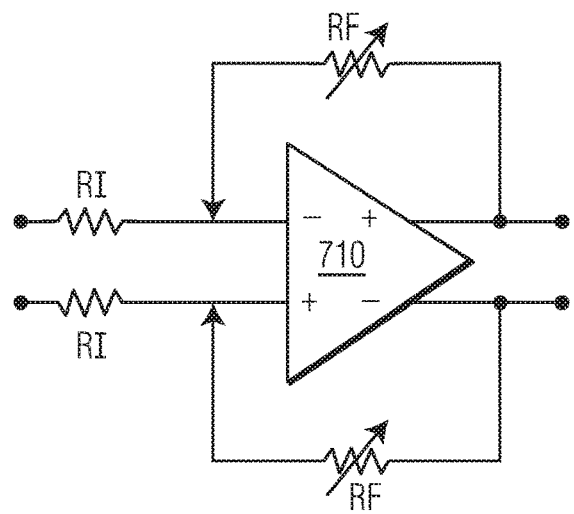
FIGS. 7A to 7C illustrate embodiments of amplifier circuits.
Figure 7B:
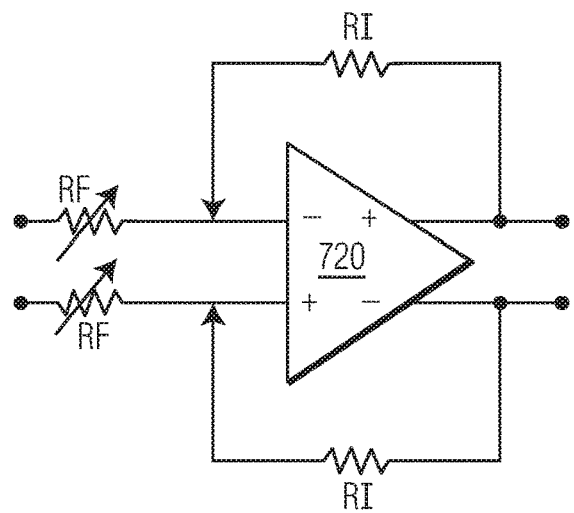
Figure 7C:
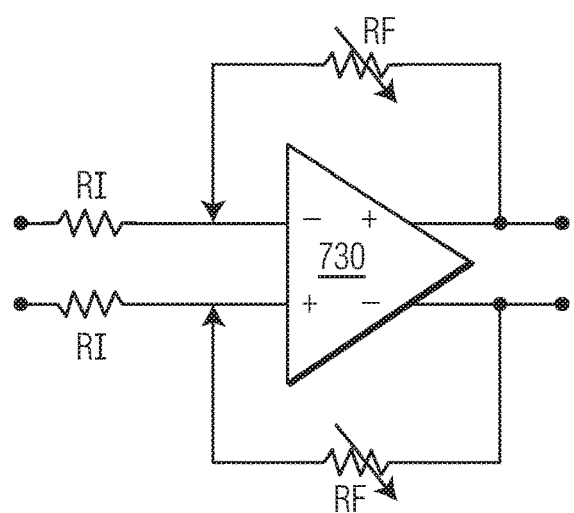

FIG. 7A illustrates an example of circuit for implementing the PGA 510 in the main channel, and FIGS. 7B and 7C illustrates examples of circuits for implementing PGA 525 in the offset cancellation loop. In both cases, the PGA circuits are differential circuits used to implement a closed-loop gain stage. In another embodiment, the PGA circuits may be in single-ended form.

In FIG. 7A, PGA 510 includes an operational amplifier 710 with inverting and non-inverter inputs coupled to receive a differential input signal through resistors $R_I$. The operational amplifier 710 generates differential output signals which are fed back to respective inputs through variable resistors $R_F$. In this embodiment, changing the resistance values of $R_F$ (using a digital code) changes the gain G of the PGA. For example, when $R_I$ as a fixed resistance value, the gain G of PGA 510 may be expressed as: $|G|=R_F/R_I$.

In FIG. 7B, PGA 525 may be the same as PGA 510 in FIG. 7A except that resistors $R_I$ are coupled along the feedback loop and variable resistors $R_F$ are coupled to the differential inputs of operational amplifier 720. The value of the variable resistor $R_F$ may be set by a digital code which may be the same or different from the digital code used to set the resistance of $R_F$ in PGA 510.

In FIG. 7C, PGA 25 may have resistors $R_I$ coupled to the differential inputs of operational amplifier 730 and variable resistors $R_F$ are coupled along the feedback loops. The value of the variable resistor $R_F$ may be set by a digital code which may be the same or different from the digital code used to set the resistance of $R_F$ in PGA 510.

In one embodiment, the gain A of the amplifier circuits of FIGS. 7B and 7C may be set to be the inverse of the gain G in the amplifier circuit of FIG. 7A, e.g., $A=R_F/R_I$ based on a digital code that is an inverse of the digital code used to set the resistance value (and thus gain G) for resistor $R_F$ in PGA 10. Also, in FIGS. 7B to 7C, the operational amplifier (e.g., 720 or 730) in PGA 525 may be low-current and low-bandwidth operational amplifiers, relative to the operational amplifier 710 in PGA 510. In one embodiment, the operational amplifier (720 or 730) in PGA 25 may use the same resistors as PGA 510 but may perform a code conversion for the digital code of PGA 510 to generate the digital code for setting the resistance value of $R_F$ (and thus the gain A) of PGA 525.

Figure 8A:
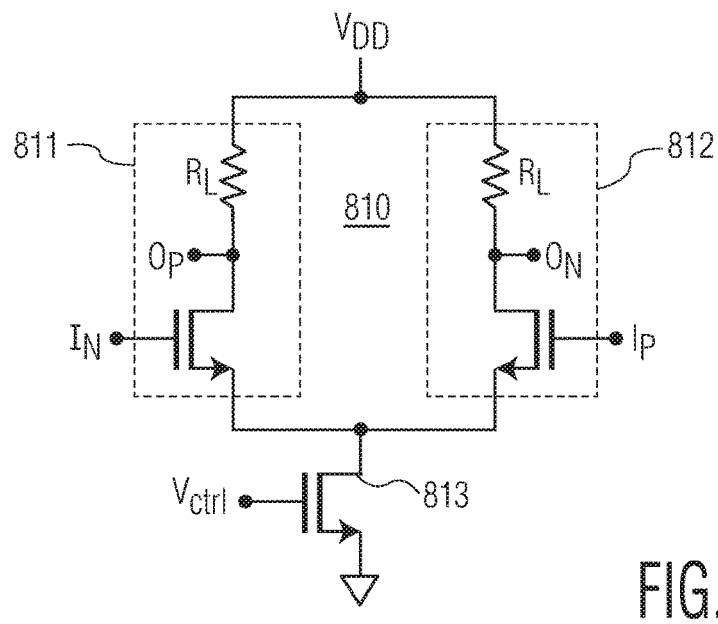
FIGS. 8A and 8B illustrate embodiments of amplifier circuit s and FIG. 8C illustrates gain curves for amplifiers in accordance with one embodiment.

FIG. 8A illustrates an embodiment of an open-loop voltage-controlled gain amplifier (VGA) 810 that may be used to implement the gain amplifier 510 in FIG. 5 (or gain amplifier 10 in FIG. 1). Like in previous embodiments, amplifier 810 is a differential circuit but may be a single-ended circuit in another embodiment.

Referring to FIG. 8A, amplifier 810 includes a first amplifier circuit 811 and a second amplifier circuit 812, both of which are coupled to a common bias transistor 813. The first amplifier circuit 811 includes a resistor $R_L$ coupled between a supply voltage $V_{DD}$ and a transistor. The gate of transistor is coupled to receive one of the differential input signals, and an output node $O_P$ is coupled between $R_L$ and the transistor. The second amplifier circuit 812 has a similar configuration with respect to a second one of the differential input signals and output node $O_N$.

In operation, the bias current applied by transistor 813 is controlled by a voltage control signal Vctrl, which, for example, may be output from a controller of the receiver or other host system or circuit. The bias sets the gain G of amplifier 810, for example, based on a curve for G set forth in FIG. 8C. In one embodiment, the gain G may be expressed as follows: G=K1*Vctrl, where K1 is a predetermined gain control factor determined, for example, based on device/design parameters for the linear range.

Figure 8B:
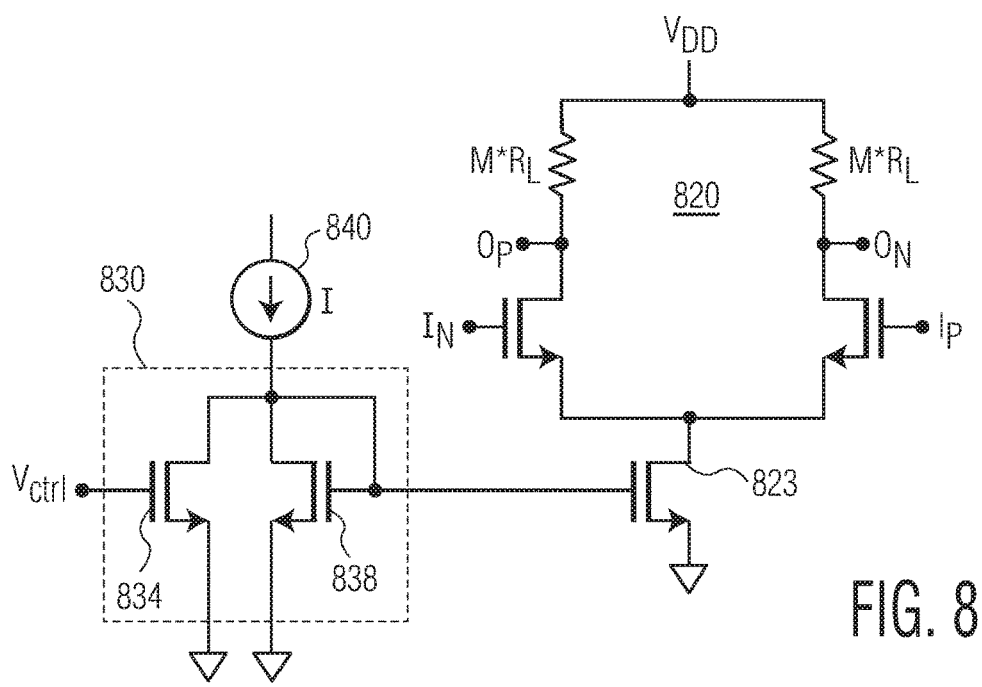

FIG. 8B illustrates an embodiment of an open-loop voltage-controlled gain amplifier (VGA) 820 that may be used to implement the gain amplifier 525 in FIG. 5. Like in previous embodiments, amplifier 820 is a differential circuit but may be a single-ended circuit in another embodiment. In FIG. 8B, amplifier 820 includes a circuit similar to amplifier 810 except that resistance value $R_L$ is multiplied by a factor M. The value of factor M in FIG. 8B and the bias current to be applied by transistor 823 may be set so that the gain of VGA 525 is the inverse of the gain G of VGA 510 (e.g., A=1/G) in order to maintain the high-pass corner frequency of the gain stage at a constant level, or at least two within a constant predetermined range.

Figure 8C:
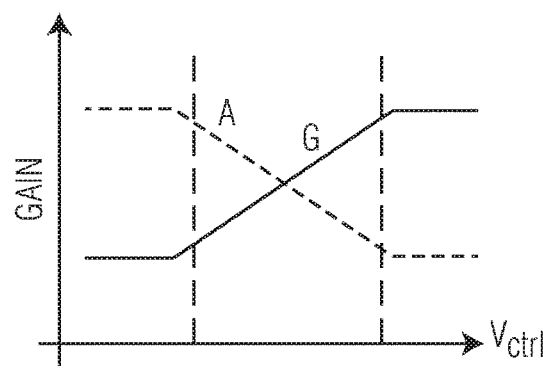

In amplifier 820, the gate of bias transistor 823 may be set by a control circuit 830 formed from two NMOS transistors 834 and 838 coupled between a current source 840 and a reference potential, e.g., ground. Transistor 834 has a gate coupled to receiver the control signal Vctrl and a source commonly connected to the drain and gate of transistor 838. The gate of transistor 838 is coupled to the gate of the bias transistor 823. In operation, transistors 834 and 838 operate in the linear range to regulate the gate signal input into bias transistor 823, and thus the amount of bias current, to set the gain A of the VGA 525. As illustrated in FIG. 8C, the gain A of VGA 25 may be based on an inverse of gain G of VGA 510. In one embodiment, gain A may be expressed as follows: A=K2*Vctrl, where K2 is a predetermined gain control factor determined, for example, based on device/design parameters for the linear range.

Figure 9:
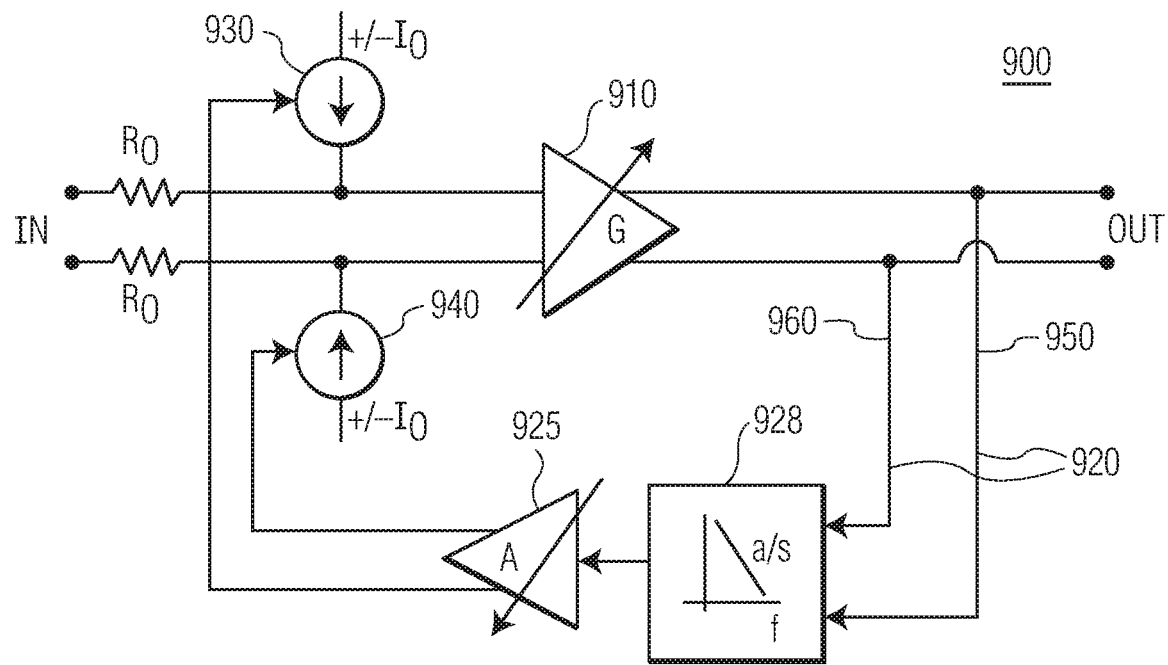
FIG. 9 illustrates another embodiment of a gain stage.

FIG. 9 illustrates another embodiment of a gain stage which includes a gain amplifier 910 and an offset cancellation loop 920 coupled to the gain amplifier. The gain amplifier 910 may be a first variable-gain amplifier which amplifies an input signal In in differential form to generate an output signal Out with increased gain. The differential input signal In may be coupled to the gain amplifier 910 through respective resistors $R_O$, and current sources 930 and 940 are coupled between respective ones of these resistors and gain amplifier 910. The current sources 930 and 940 inject an amount of current component+/−$I_0$ into respective ones of the differential input lines of the gain amplifier 910 based on two control signals 950 and 960. The control signals 950 and 960 correspond to respective differential outputs of a gain amplifier 925 in the offset cancellation loop 920.

The gain amplifier 925 may generate the differential output signals 950 and 960 based on a single input output from a filter 928 (e.g., low-pass filter) in the offset cancellation loop. The filter (or integrator) 928 may have a transfer function that is the same as or an inverse of the transfer function of the filter implemented by gain amplifier 910. The filter 928 may generate the single output to gain amplifier 925 based on the differential output signals from the gain amplifier 910. In one embodiment, the offset cancellation range of the feedback loop 920 may be expressed, for example, as +/−$I_0$*$R_O$ for each of the differential inputs into the gain amplifier in the main channel. The offset cancellation range may be a predetermined range based on a maximum gain (determined, for example, by a Monte Carlo simulation with some predetermined extra margin) for the intended application.

Figure 10:
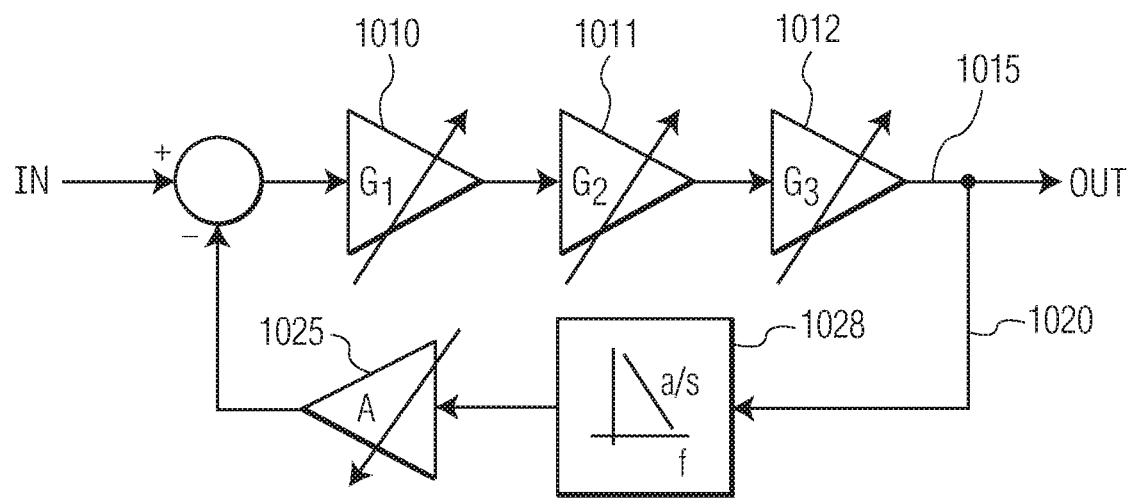
FIG. 10 illustrates another embodiment of a gain stage.

FIG. 10 illustrates an embodiment of a gain stage which is similar to the gain stage of FIG. 1 (or FIG. 5) except that the gain amplifier 10 is replaced with a plurality of amplifiers 1010, 1011, and 1012. In this embodiment, three amplifiers are shown along the main channel 1015, but two or four or more amplifiers may be included in another embodiment.

Referring to FIG. 10, the gains G1, G2, and G3 of the amplifiers along the main channel 1015 may add up to the gain G of the amplifier 10 in FIG. 1, e.g., G=G1*G2*G3. The gains G1, G2, and G3 may all be the same or may be in different proportions. The gain amplifier 1025 in the offset cancellation loop 1020 may be the same as the gain amplifier in FIG. 1 (which operates both as a filter and amplifier), or may include a filter (e.g., low-pass filter) 1028 that applies an inverse transfer function to the output of amplifier on the main channel. In this case, the gain amplifier 1025 would only adjust gain. As a result, the offset cancellation loop 1020 may maintain the high-pass pole (or high-pass corner frequency) at a constant level.

Figure 11A:
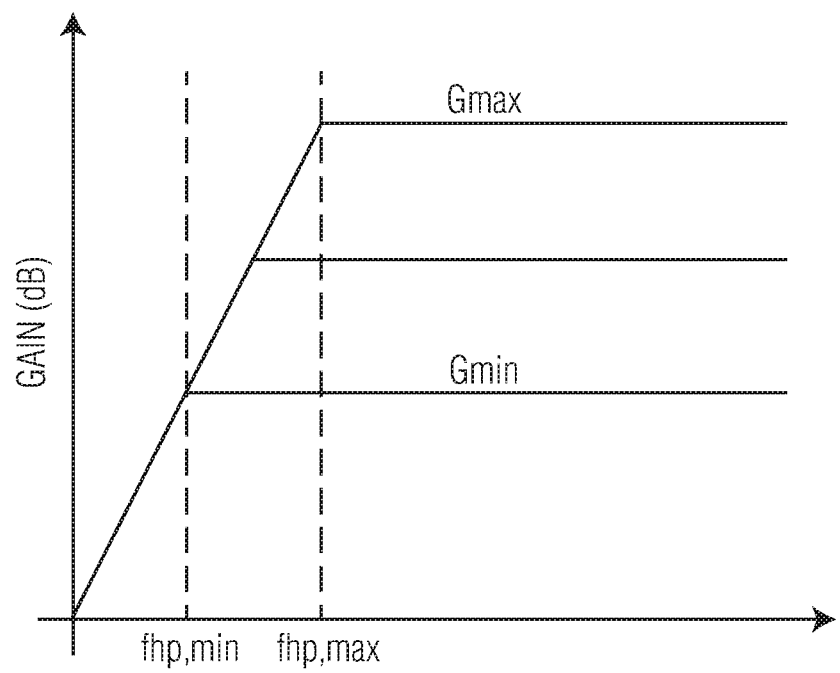
FIGS. 11A and 11B illustrate comparative results of gain stages.
Figure 11B:
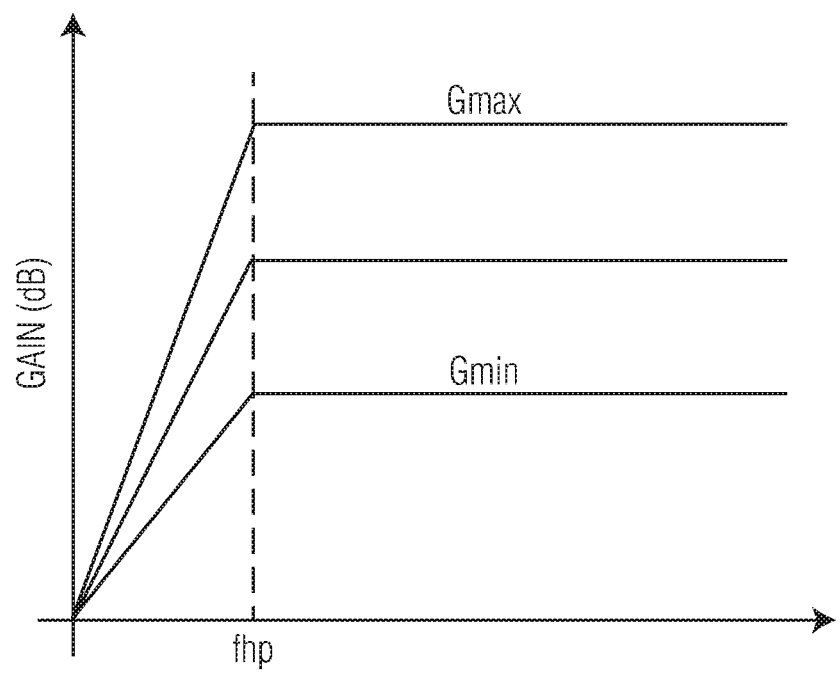

FIG. 11A illustrates an example of a frequency response of a proposed gain stage and FIG. 11B illustrates an example of a frequency response of a gain state in accordance with one or more embodiments described herein. As illustrated in FIG. 11A, the high-pass corner frequency fhp of the gain stage shifts with fluctuations in gain. In contrast, a high-pass corner frequency fhp in accordance with one or more embodiments as illustrated in FIG. 11B has a constant high-pass corner frequency, irrespective of fluctuations in gain.

In addition to the performance improvements that are achieved by one or more of the embodiments described herein, the gain amplifier in the offset cancellation loop may have a much lower bandwidth, does not have to operate based on high current (or high power), and does not have to operate in accordance with a linear frequency response, which may be the case with the gain amplifier in the main channel. In other words, the gain amplifier in the offset cancellation loop may be a cheaper amplifier which can produce improved performance at much lower cost. Moreover, the gain amplifier in the offset cancellation loop is not required to be as accurate as the gain amplifier in the main channel, at least in respect to gain range.

When PGAs are used for the gain amplifiers, the gain amplifier in the offset cancellation loop may use a digital control signal with fewer bits than other designs, which may increase the efficiency and processing overhead of one or more of the described embodiments. When VGAs are used for the gain amplifiers, at least the gain amplifier in the offset cancellation loop may have lower accuracy requirements, which may save on costs. Also, in one embodiment, variations in process, voltage, and temperature may be taken into consideration and compensated by the offset cancellation loop.

FIG. 12 illustrates an embodiment of a control system for a gain stage, which, for example, may correspond to any of the gain stage embodiments described herein. The control system includes a controller 1210, a first signal line 1220, and a second signal line 1230. The first signal line 1220 is coupled to a first amplifier and the second signal line 1230 is coupled to a second amplifier of the gain stage 1240. The first and second amplifiers may be included in a gain stage in accordance with any of the embodiments described herein, e.g., the first amplifier may be coupled along a main channel of a receiver or other host system or circuit and the second amplifier may be coupled along an offset cancellation loop relative to the first amplifier. In operation, the controller 1210 may output a first control signal to the first signal line and a second control signal to the second signal line in order to control the gains of the first and second amplifiers, respectively. The second control signal may control the gain of the second amplifier to maintain a high-pass corner frequency of the first amplifier at a substantially constant level for different values of the gain of the first amplifier. In one embodiment, the term "substantially" may correspond to a variation in the level of +/−10% or less for a relatively good design.

In accordance with one or more embodiments, the high-pass corner frequency of the amplifier on the main channel of a receiver may be maintained at a constant level, irrespective of variations in gain, PVT effects, and/or other anomalies. The amplifiers may be voltage-controlled gain amplifiers or programmable gain amplifiers. The amplifier in the offset cancellation loop, may be a low bandwidth and/or low current version of the amplifier in the main channel. The amplifier in the offset cancellation loop may also be a low-accuracy amplifier, and in some cases what may be considered to be a cheap version of the amplifier in the main channel of the gain stage. The embodiments may be applied to any type of gain stage or receiver chain.

Moreover, one or more embodiments described herein may have negligible impact on noise and current consumption of the gain stage and/or components in the main channel. The offset cancellation loop and its attendant features may also have reduced, minimum, or no adverse effect on performance of the main channel, including its amplifier. Also, a voltage control signal or digital code may be used to keep the high-pass corner frequency of the main channel amplifier constant.

The processors, controllers, filters, integrators, and other signal generating or signal processing features of the embodiments disclosed herein may be implemented in logic which, for example, may include hardware, software, or both. When implemented at least partially in hardware, processors, controllers, filters, integrators, and other signal generating or signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented at least partially in software, the processors, controllers, filters, integrators, and other signal generating or signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the embodiments may transform the computer, processor, controller, or other signal processing device into a special-purpose processor for performing the methods described herein.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

I claim:

1. A gain stage, comprising:
a first amplifier; and
an offset cancellation loop coupled to the first amplifier, wherein the first amplifier has a first transfer function and a first gain and the offset cancellation loop includes a second amplifier having a second transfer function and a second gain, the second transfer function based on an inverse of the first transfer function and the second gain based on an inverse of the first gain, and wherein the offset cancellation loop is configured to feed back an output signal of the first amplifier to an input of the first amplifier.

2. The gain stage of claim 1, wherein the output signal fed back to the input of the first amplifier maintains a high-pass pole of the first amplifier at a substantially constant level irrespective of changes in the first gain of the first amplifier.

3. The gain stage of claim 2, wherein the high-pass pole corresponds to a high-pass corner frequency of the first amplifier.

4. The gain stage of claim 3, wherein the first transfer function is shifted by a first amount relative to the high-pass corner frequency and the second transfer function is offset by a second amount relative to the high-pass corner frequency, and wherein the second amount at least partially offsets the first amount.

5. The gain stage of claim 2, wherein the second amplifier is configured to change the second gain to correspond to changes in the first gain of the first amplifier, in order to maintain the high-pass pole of the first amplifier at the substantially constant level.

6. The gain stage of claim 2, wherein:
the first amplifier is a voltage-controlled gain amplifier;
the second amplifier is a voltage-controlled gain amplifier;
the first gain of the first amplifier is set by a first voltage control signal; and
the second gain of the second amplifier is set by a second voltage control signal.

7. The gain stage of claim 6, wherein:
the first voltage control signal is configured to set the first gain to a value on a first gain curve, and
the second voltage control signal is configured to set the second gain to a value on a second gain curve.

8. The gain stage of claim 7, wherein:
the second gain is an inverse of the first gain,
the second gain curve is an inverse of the first gain curve, and
a product of the first gain and the second gain is a constant value.

9. The gain stage of claim 2, wherein:
the first amplifier is a programmable gain amplifier;
the second amplifier is a programmable gain amplifier;
the first gain of the first amplifier is set by a first digital code; and the second gain of the second amplifier is set by a second digital code.

10. The gain stage of claim 9, wherein:
the first digital code is to set the first gain to a value on a first waveform, and
the second digital code is to set the second gain to a value on a second waveform.

11. The gain stage of claim 10, wherein:
the second waveform is an inverse of the first waveform, and
a product of the first gain and the second gain is set to maintain the high-pass pole of the first amplifier at the substantially constant level.

12. The gain stage of claim 1, wherein:
the first amplifier includes a plurality of amplifier circuits,
the plurality of amplifier circuits has a plurality of gains, and
the second gain of the second amplifier is based on an inverse of a sum of the plurality of gains of the plurality of amplifier circuits.

13. A control system, comprising:
a first signal line coupled to a first amplifier;
a second signal line coupled to a second amplifier; and
a controller configured to output a first control signal to the first signal line and a second control signal to the second signal line, the second control signal to control a gain of the second amplifier to maintain a high-pass corner frequency of the first amplifier at a substantially constant level for different values of the gain of the first amplifier.

14. The control system of claim 13, wherein the controller is configured to control the gain of the second amplifier to be an inverse of the gain of the first amplifier.

15. The control system of claim 13, wherein the high-pass corner frequency corresponds to a high-pass pole of a filter implemented by the first amplifier.

16. The control system of claim 13, wherein:
the first amplifier is a voltage-controlled gain amplifier,
the first control signal includes a first voltage control signal;
the second amplifier is a voltage-controlled gain amplifier; and
the second control signal includes a second voltage control signal.

17. The control system of claim 13, wherein:
the first amplifier is a programmable gain amplifier;
the first control signal is a first digital control signal;
the second amplifier is a programmable gain amplifier; and
the second control signal is a second digital control signal.

18. The control system of claim 17, wherein the controller is configured to convert the first digital control signal into the second digital control signal.

19. A gain stage, comprising:
a first amplifier; and
an offset cancellation loop coupled to the first amplifier,
wherein the first amplifier has a first transfer function and a first gain and the offset cancellation loop includes a second amplifier coupled to a filter, the second amplifier including a second gain based on an inverse of the first gain and the filter having a second transfer function based on an inverse of the first transfer function, and wherein the offset cancellation loop is configured to feed back an output signal of the first amplifier to an input of the first amplifier.

20. The gain stage of claim 19, wherein the output signal fed back to the input of the first amplifier maintains a high-pass pole of the first amplifier at a substantially constant level irrespective of changes in the first gain of the first amplifier.

21. The gain stage of claim 19, wherein:
the first amplifier operates at a first current and a first bandwidth,
the second amplifier operates at a second current and second bandwidth, and
the second current is lower than the first current and the second bandwidth is narrower than the first bandwidth.

\* \* \* \* \*